(12) United States Patent
Sasuga

(10) Patent No.: US 7,199,400 B2
(45) Date of Patent: Apr. 3, 2007

(54) SEMICONDUCTOR PACKAGE

(75) Inventor: Masatoshi Sasuga, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/934,453

(22) Filed: Sep. 7, 2004

(65) Prior Publication Data

US 2005/0051792 A1    Mar. 10, 2005

(30) Foreign Application Priority Data

Sep. 9, 2003  (JP) ............................. 2003-317570

(51) Int. Cl.
*H01L 27/15* (2006.01)
(52) U.S. Cl. ............................. 257/81; 257/98; 257/99; 438/22; 361/714; 361/715; 361/717
(58) Field of Classification Search ..................... None
See application file for complete search history.

(56) References Cited

U.S. PATENT DOCUMENTS

| 6,605,366 B2 * | 8/2003 | Yamaguchi et al. ..... 428/473.5 |
| 6,835,960 B2 * | 12/2004 | Lin et al. ...................... 257/81 |
| 6,858,880 B2 * | 2/2005 | Horiuchi et al. ............ 257/100 |
| 2001/0013423 A1 * | 8/2001 | Dalal et al. .................. 174/260 |
| 2006/0018120 A1 * | 1/2006 | Linehan et al. ............. 362/247 |

FOREIGN PATENT DOCUMENTS

| JP | 08-064717 | 3/1996 |
| JP | 11-126796 | 5/1999 |
| JP | 2001-203237 | 7/2001 |
| JP | 3316095 | * 6/2002 |
| JP | 2003-163378 | * 6/2003 |

OTHER PUBLICATIONS

Definition of Thermal Plastic Defined by www.wikipedia.com search word Thermoplastic.*

* cited by examiner

*Primary Examiner*—Hsien-Ming Lee
*Assistant Examiner*—Su C. Kim
(74) *Attorney, Agent, or Firm*—Browdy and Neimark, PLLC

(57) ABSTRACT

A semiconductor package comprising a base material, an FPC substrate bonded through the intervention of an adhesive or an adhesive sheet on the base material and a semiconductor chip mounted on the FPC substrate, the semiconductor chip being mounted on the FPC substrate by FC bonding, the base material being formed by a resin, the base material having a concave portion or hole, and the semiconductor chip being mounted on the FPC substrate inside the concave portion or hole of the base material.

5 Claims, 3 Drawing Sheets

Prior Art

SEMICONDUCTOR PACKAGE

CROSS REFERENCE TO THE RELATED APPLICATION

The application claims the priority benefit of Japanese Patent Application No.2003-317570, filed on Sep. 9, 2003, the entire descriptions of which are incorporated herein by reference.

BACKGROUND OF THE INVENTION

1. Field of the Invention

The present invention relates to a semiconductor package, more specifically to a semiconductor package having a sufficient strength to thermal shock.

2. Description of Related Art

Conventionally, it has been required to mount a semiconductor chip such as an integrated circuit chip (hereinafter referred to as an IC chip) or a light emitting diode chip (hereinafter referred to as an LED chip) on a base material such as a PCB substrate or an MID (Molded Interconnect Device) substrate, or the like, by flip chip (hereinafter referred to as FC) bonding in order to miniaturize a semiconductor package. However, because thermal expansion coefficients of a material of the semiconductor chip such as the IC chip and a material of the PCB substrate or thermal expansion coefficients of the material of the IC chip and a material of the MID substrate are vastly different, there is a problem in that a connecting part of the IC chip and a wiring on each substrate is easily broken due to the thermal stress generated between the IC chip and the PCB substrate or the MID substrate during operations.

More specifically, if the IC 12 chip having bumps 10 formed on its terminals (not shown) is mounted on the PCB substrate 14 by FC bonding, as shown in FIG. 2A, connecting portions of the IC chip and the PCB substrate through the bumps 10 are easily broken due to thermal shock, because a thermal expansion coefficient of silicon which is a main material of the IC chip 12 is about 3 ppm/° C., and a thermal expansion coefficient of glass epoxy or BT resin which is a main material of the PCB substrate is about 12 to 17 ppm/° C.

Moreover, if a copper wiring or a copper pattern 18 is formed by plating on the MID substrate 16 formed as a molded resin article and the IC chip 12 in which the bumps 10 are formed on terminals thereof is mounted on the MID substrate 16 by FC bonding, as shown in FIG. 2B, then, since a thermal expansion coefficient of a resin which is a main material of the MID substrate is about 40 ppm/° C., the strength of the package shown in FIG. 2B against thermal shock is decreased is even more than that of the package shown in FIG. 2A.

To resolve the above-described of resistance to thermal shock in the semiconductor package, a method for mounting the IC chip 12 provided with the bumps 10 on a ceramic substrate 8 provided with the copper pattern by FC bonding has also been used as shown in FIG. 2C. A thermal expansion coefficient of the ceramic substrate 8 is about 7 ppm/° C., which is approximately the same as that of silicon, therefore a high strength is acquired. However, there is a problem in that the manufacturing costs of the semiconductor package become very high and the products to which the method is applicable are limited.

To resolve this problem, a proposal there has been disclosed in which a thermal stress generated by a difference between thermal expansion coefficients of an IC chip and a base material is reduced by using a soldering bump having a high temperature fusion point and using a material having a small Young's modulus for a solder of the soldering bump (for reference, see Japanese Patent Laid-Open H8-64717).

However, there is a limitation on the degree to which the Young's modulus of the soldering bump, can be lowered hence it is difficult to obtain a sufficient strength in the IC chip and so on even if the means described above is used.

A proposal has also been disclosed in which generation of stress is reduced when manufacturing a semiconductor package by maintaining an IC chip and a substrate at a high temperature when manufacturing the semiconductor (for reference, see Japanese Patent Laid-Open H11-126796). However, even if the semiconductor package is manufactured by such a method, a semiconductor package having a small stress can be made at the beginning of manufacturing thereof, but stress is still generated by a difference between thermal expansion coefficients of the IC chip and the base material in thermal history after the semiconductor package has been manufactured.

Moreover, a proposal has been disclosed in which an IC chip is mounted on a flexible printed circuit (hereinafter referred to as FPC) substrate by FC bonding and electrodes of the FPC substrate and electrodes of a PCB substrate are connected through a sheet of an anisotropic conductive elastic body, as a result, any stress generated by a difference between thermal expansion coefficients of the IC chip and the PCB substrate is reduced by elastic function of the sheet of the anisotropic conductive elastic body (for reference, see Japanese Patent Laid-Open 2001-203237).

This method produces a greater for thermal stress reduction effect. However, connecting the electrodes of the FPC substrate and the PCB substrate through a sheet of an anisotropic conductive elastic body is a technology for producing an advantageous effect when used for a semiconductor package having a great number of pins; if it is used for a semiconductor package having a small number of pins, there is a problem in that a semiconductor package with a small number of pins is more expensive than a case where a ceramic substrate is used.

Furthermore, it has been required that a concave portion or hole for arranging a light-emitting member is provided in a base material of a semiconductor package and a reflecting film is provided in the concave portion and so on, in order to increase luminous efficiency in the light-emitting member such as an LED chip (for reference, see Japanese Patent Laid-Open 2003-163378). However, because the base material having such a concave portion is, for reasons of cost, made of a resin with high thermal expansion coefficient, a problem arises, regarding a thermal stress generated by a difference in the thermal expansion coefficients of the light-emitting member and the base material, which just as serious as that described above.

SUMMARY OF THE INVENTION

Therefore, an object of the present invention is to provide an inexpensive semiconductor package having a simple structure and configured to improve a matter that a connecting portion of a semiconductor chip and a copper pattern on a base material is easily broken by a temperature change because thermal expansion coefficients of the base material and the semiconductor chip mounted on the base material are different.

To accomplish the above-mentioned object, a semiconductor package in an aspect of the present invention comprises a base material, an FPC substrate bonded on the base material through the invention of an adhesive or an adhesive sheet, and a semiconductor chip mounted on the FPC substrate.

Here, the semiconductor chip is mounted on the FPC substrate by FC bonding in one embodiment.

Moreover, the base material is formed by molding a resin.

DETAILED DESCRIPTION OF THE PREFERRED EMBODIMENTS

Hereinafter, embodiments of a semiconductor package according to the present invention will be explained with reference to FIGS. 1A to 1D.

[First Embodiment]

Figure 1A:
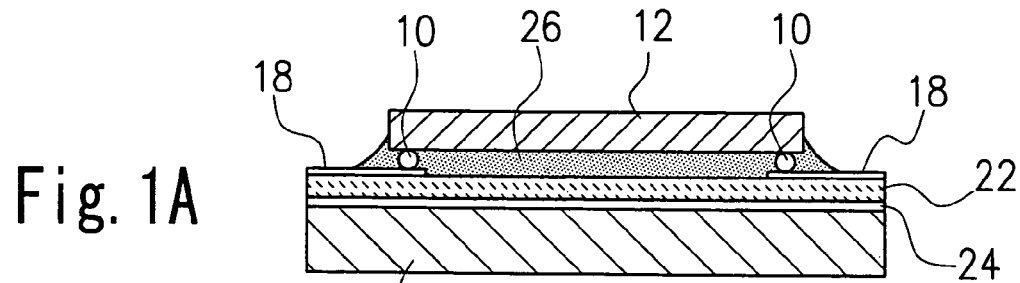
FIGS. 1A, 1B and 1C are sectional views of embodiments of a semiconductor package according to the present invention.

In FIG. 1A, gold bumps 10 are formed on terminals of a semiconductor chip 12 such as an IC chip or an LED chip. An FPC substrate in which a copper pattern 18 is formed on an FPC substrate made of polyimide or polyester material is bonded on a flat plate like base material 20, which is formed as a substrate by molding a resin through, for example, an acrylic adhesive 24 having a small Young's modulus. The semiconductor chip 12 on which the gold bumps 10 are formed, is disposed on the FPC substrate 22, a heat-hardening resin 26 is filled in a gap between the semiconductor chip 12 and the FPC substrate 22. The gold bumps 10 on the semiconductor chip 12 and the copper pattern 18 on the FPC substrate 22 are connected through welding with pressure formed by hardening and shrinkage of the heat-hardening resin generated when heating.

With the semiconductor package structured in this way, any thermal stress generated by the difference between the thermal expansion coefficients of the semiconductor chip 12 and the molded base material 20 is absorbed by means of the FPC substrate 22 so that a mechanical load is not imparted to the semiconductor chip 12 and the base material 20.

In other words, in the case where the semiconductor chip 12 is an IC chip, the FPC substrate 22 extends and contracts in accordance with the thermal expansion of silicon which is a base material of the IC chip 12 without generating any thermal stress in particular, because the thermal expansion coefficient of the copper pattern 18 on the FPC substrate 22 of polyimide and polyester is about 16 ppm/° C., which is greater than that of the silicon, while the thickness thereof is 10 to 20 μm. The thermal expansion coefficients of the IC chip 12 and the base material 20, at about 3 ppm/° C. and about 40 ppm/° C., respectively, differ greatly, but because the FPC substrate 22 made of polyimide or polyester and the acrylic adhesive 24, each of which has a small Young's modulus, are disposed between the IC chip 12 and the base material 20, the FPC substrate 22 and acrylic adhesive 24 act as a damper to allow thermal stress to be reduced considerably.

Therefore, the semiconductor package according to the present invention is able to sufficiently reduce thermal shock.

Moreover, because an acrylic adhesive is used, it is possible to produce the semiconductor package very inexpensively in comparison with a semiconductor package using a sheet of a ceramic or anisotropic conductive elastic sheet.

Meanwhile, although the gold bumps 10 on the IC chip 12 and the copper pattern 18 on the FPC substrate 22 are connected by use of the welding pressure method for FC bonding, another FC bonding method may of course be used in the embodiment, such as connecting the soldering bumps and copper pattern 18 on the FPC substrate 22 by use of reflow, for example.

Furthermore, the FPC substrate 22 is bonded on the base material 20 through the intervention of the acrylic adhesive having a small Young's modulus, but, may, of course, be bonded on the substrate by other adhesive means, for example, using an adhesive sheet having a small Young's modulus.

[Second Embodiment]

Figure 1B:
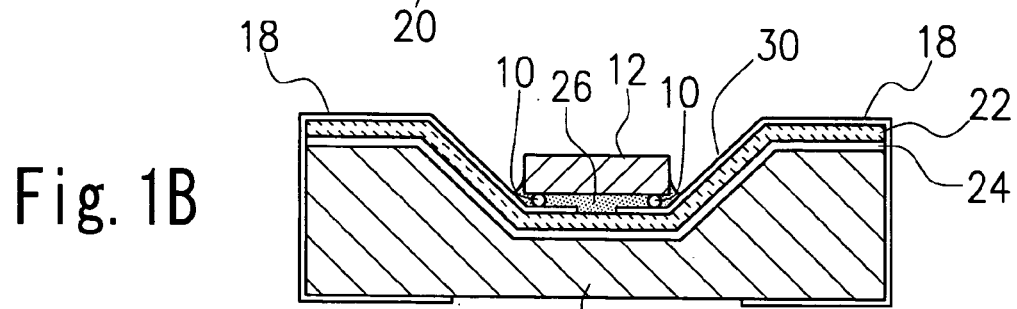

FIG. 1B illustrates an example of a semiconductor package using a base material 28 having a concave portion 30 in place of the flat plate-shaped base material 20 used in FIG. 1A. The IC chip 12 is mounted on the copper pattern 18 formed on the FPC substrate 22 inside the concave portion 30. The copper pattern 18 partly extends to the lower surface of the base material 28.

Figure 1C:
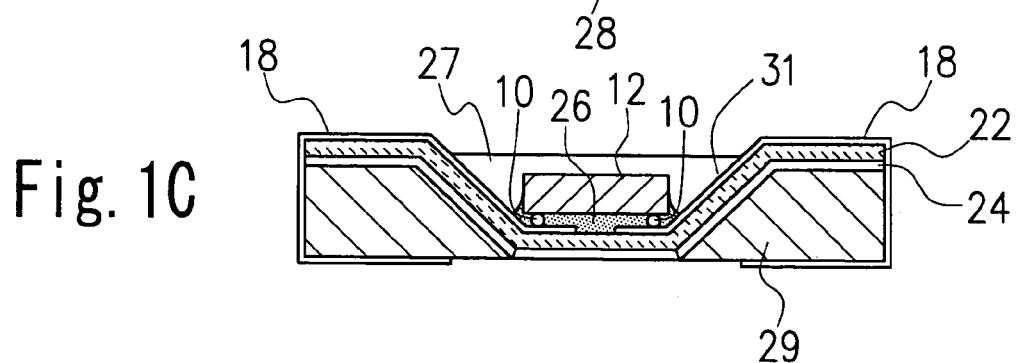
Figure 1D:
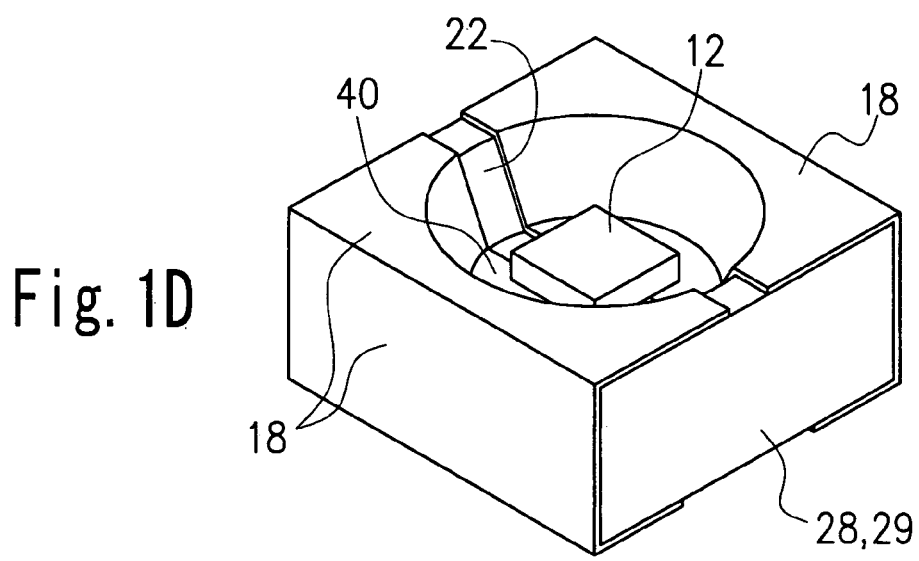
FIG. 1D is a perspective view of the semiconductor package.
Figure 1C:
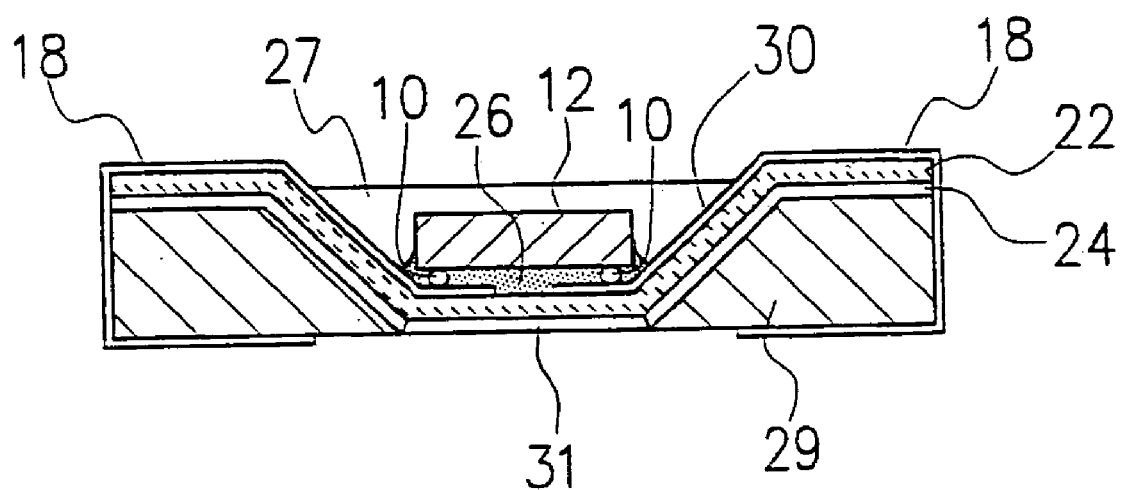
Figure 2A:
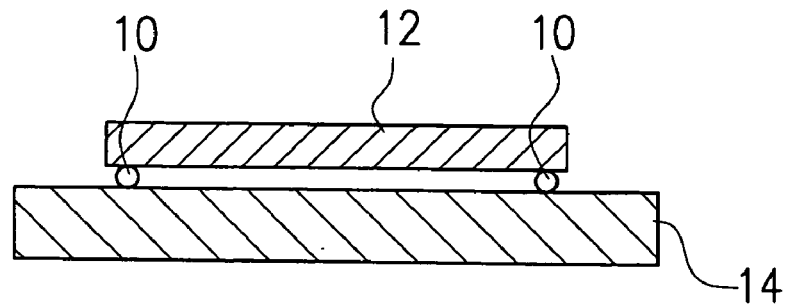
FIGS. 2A, 2B and 2C are sectional views for explaining conventional semiconductor packages.
Figure 2B:
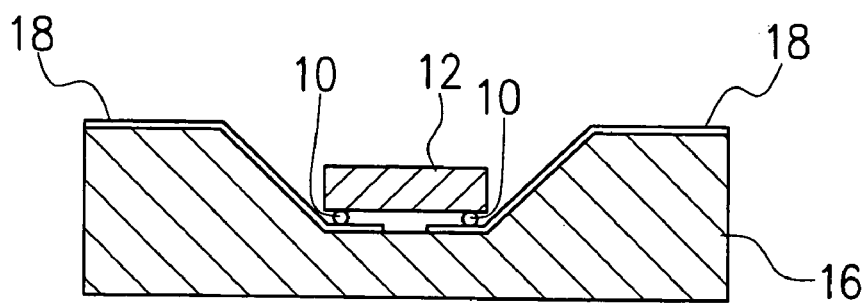
Figure 2C:
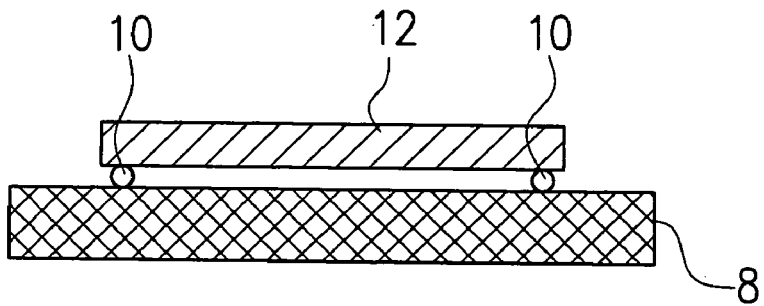

Meanwhile, in FIGS. 1B to 1D, the same numerals are attached to the similar parts as in FIG. 1A. There is an advantageous effect that the concave portion 30 can be easily formed when using the base material comprising a molded article, as shown in FIG. 1B.

FIG. 1C illustrates an example of a semiconductor package using a base material 29 having a hole 31 in place of the flat plate-shaped base material 20 in FIG. 1A. The IC chip 12 is mounted on the copper pattern 18 formed on the FPC substrate 22 inside the hole 31.

The hole 31 is structured to pass through the base material 29 in such a manner that no base material 29 exists at the bottom of the hole, in contrast to the concave portion 30 in FIG. 1B. In the case where a hole 31 is formed in the base material 29, the material for adhesion also does not exist at the bottom of the hole so that, for example, an adhesive sheet having a hole which has almost the same size as the hole 31 may be used. With such a structure, there are advantageous effects in that the semiconductor package can be further thinned, the heat releasing efficiency of the semiconductor package is increased, and the thermal stress on the base material comprising the molded article is reduced.

Moreover, the periphery of the semiconductor chip 12 is entirely protected by transparent epoxy or silicon 27, as shown in FIG. 1C. By such protection, the reliability of the semiconductor package is enhanced and simplification of handling thereof is achieved. Because the member 27 used for protection is transparent, there is no problem concerning the optical characteristics of the semiconductor package. Of course, the above-mentioned protecting structure is applicable to the semiconductor package in FIG. 1B. It is also possible to standardize the heat-hardening resin 26 and the transparent epoxy or silicon 27 in accordance with characteristics of the FC bonding method and the transparent epoxy.

There is an advantageous effect that the hole 31 can be easily formed when using the substrate comprising a molded article, as shown in FIG. 1C.

FIG. 1D is a perspective view of the semiconductor package shown in FIGS. 1B and 1C.

If a molded resin forming the base material 28 or 29 remains at the bottom of the dent portion 40 of the substrate, the dent portion 40 forms the concave portion 30, in the molded resin does not remain at the dent portion and the dent portion passes through the substrate, the dent portion forms the hole 31.

If a reflecting film is provided on the bottom and side surfaces of the concave portion 30, or the hole 31, it is possible to form a semiconductor package having a higher light-emitting efficiency when the semiconductor 12 is a light-emitting member such as an LED chip.

According to the present invention, as described above, because the FPC substrate is provided between the semiconductor and the base material, it is possible to provide a semiconductor package which can sufficiently reduce thermal stress and whose structure is simple, and which can be inexpensively manufactured.

Although the preferred embodiments have been described, it should be noted that the present invention is not limited to the embodiments, and various changes and modifications are made for the embodiments.

What is claimed is:

1. A semiconductor package comprising:
    a resinous base material having a mold-formed concave portion in the resinous base material;
    a hole provided at a bottom of the concave portion in the resinous base material and passing through the resinous base material;
    a flexible printed circuit board bonded on a surface of the concave portion through an adhesive or an adhesive sheet and configured to close the hole; and
    a semiconductor mounted on the flexible printed circuit board,
    wherein the semiconductor is mounted on the flexible printed board at the bottom of the concave portion above the hole,
    wherein the flexible printed circuit board is formed by polyimide or polyester, and
    wherein a copper pattern is provided on a surface of the flexible printed circuit board.

2. The semiconductor package according to claim 1,
    wherein the adhesive or adhesive sheet is made of an acrylic based material.

3. The semiconductor package according to claim 1,
    wherein epoxy or silicone is provided between the semiconductor and the flexible printed circuit board and comprising means for protecting the semiconductor and the flexible printed circuit board.

4. The semiconductor package according to claim 1,
    wherein the copper pattern provided on the surface of the flexible printed circuit board has a thickness of 10 to 20 µm.

5. The semiconductor package according to claim 1,
    wherein the semiconductor comprises an IC or an LED including bumps mounted on the copper pattern by flip chip bonding.

* * * * *